United States Patent [19]
Collier et al.

[11] Patent Number: 6,054,849
[45] Date of Patent: Apr. 25, 2000

[54] ELECTRICAL TESTING DEVICE

[76] Inventors: Stephen D. Collier; Wayne E. Hughes, both of P.O. Box 187, Owensboro, Ky. 42302

[21] Appl. No.: 08/953,402

[22] Filed: Oct. 17, 1997

[51] Int. Cl.$^7$ .................................................. G01R 31/02
[52] U.S. Cl. ........................... 324/133; 324/510; 324/556
[58] Field of Search .................................... 324/509, 510, 324/133, 556

[56] References Cited

U.S. PATENT DOCUMENTS

| | | | |
|---|---|---|---|
| 3,723,863 | 3/1973 | Myers | 324/510 |
| 4,859,932 | 8/1989 | Whitley | 324/72.5 |
| 5,280,251 | 1/1994 | Strangio | 324/539 |
| 5,285,163 | 2/1994 | Liotta | 324/133 |
| 5,477,133 | 12/1995 | Earle | 324/72.5 |
| 5,572,117 | 11/1996 | Yoon | 324/115 |
| 5,604,439 | 2/1997 | Walkington et al. | 324/504 |
| 5,625,285 | 4/1997 | Virgilio | 324/133 |

FOREIGN PATENT DOCUMENTS

| | | |
|---|---|---|
| 245742 | 2/1961 | Australia . |
| 2828095 | 1/1980 | Germany . |
| 1587043 | 3/1981 | United Kingdom . |

*Primary Examiner*—Josie Ballato
*Assistant Examiner*—Jose M. Solis
*Attorney, Agent, or Firm*—Richard C. Litman

[57] ABSTRACT

An electrical testing device for determining the continuity between ground terminals of an electrical power cord and determining the electrical grounding of an electrical power tool. The electrical testing device can also be configured to determine the proper polarity on each of the hot, negative, and ground cord wires of an electrical power extension cord. The electrical testing device includes a plastic case housing one or more batteries which supply power to a test button and the ground terminal of a female receptacle installed in the case. The top surface of the case includes a female receptacle, a test button, and a ground light. The top surface may also include a male plug and an additional female receptacle installed in the case. On the side of the case is an extending metal contact element. The test button is a single pole momentary contact test button. When this test button is actuated it closes the test button contacts thus completing a circuit which will illuminate the light if the light and the battery are good.

15 Claims, 6 Drawing Sheets

ELECTRICAL TESTING DEVICE

BACKGROUND OF THE INVENTION

1. Field of the Invention

The present invention relates to an electrical testing device for electrical power extension cords and electrical power tools.

2. Description of Related Art

The maintenance of electrical power extension cords and electrical power tools in a proper and safe operating condition is a problem to which considerable attention need be given. In particular, electrically powered extension cords and tools used at construction or plant sites must be tested for proper wiring conditions daily so as to comply with governmental safety regulations as well as to insure their proper operating condition. In order to determine the proper and safe operating condition of a power tool or power extension cord, it is necessary to perform a number of individual tests. Due to the large number of cords and tools which may be utilized at a construction or plant site, it is necessary that the individual tests be performed as expediently as possible without sacrificing any quality and reliability in the testing procedure.

U.S. Pat. No. 4,859,932, issued on Aug. 22, 1989 to William E. Whitley, describes a multi-function tester. Whitley does not suggest the electrical testing device according to the claimed invention.

U.S. Pat. No. 5,280,251, issued on Jan. 18, 1994 to Christopher E. Strangio, describes a multi-conductor cable tester. Strangio does not suggest the electrical testing device according to the claimed invention.

U.S. Pat. No. 5,285,163, issued on Feb. 8, 1994 to William A. Liotta, describes a hand-held tester which performs both off-line continuity tests and on-line voltage tests for electrical cables and equipment. Liotta does not suggest the electrical testing device according to the claimed invention.

U.S. Pat. No. 5,477,133, issued on Dec. 19, 1995 to Kent L. Earle, describes an electrical test device for testing circuits. Earle does not suggest the electrical testing device according to the claimed invention.

U.S. Pat. No. 5,572,117, issued on Nov. 5, 1996 to Hee Y. Yoon, describes a multi-meter which is capable of measuring a Z-state of an output signal from a thing to be measured, in addition to high and low states thereof. Yoon does not suggest the electrical testing device according to the claimed invention.

U.S. Pat. No. 5,604,439, issued on Feb. 18, 1997 to Clifford L. Walkington et al., describes a tractor/trailer lamp circuit continuity test device. Walkington et al. do not suggest the electrical testing device according to the claimed invention.

U.S. Pat. No. 5,625,285, issued on Apr. 29, 1997 to Larry A. Virgilio, describes a self-contained, plug-in, hand-held device for testing the current carrying ability of the Hot wire and the Safety Ground return of standard AC outlets which have Hot, Neutral, and Ground connections. Virgilio does not suggest the electrical testing device according to the claimed invention.

Australia Patent document number 245,742, published on Feb. 9, 1961, describes a safety device for testing the earth lead and plug earth pin of an electrical appliance. Australia '742 does not suggest the electrical testing device according to the claimed invention.

The abstract and figure of Germany Patent document number 2,828,095, published on Jan. 10, 1980, describes a universal test plug with five contacts and five light emitting diodes (LEDs) on the bottom or front face that give a phase sequence indication. Germany '095 does not suggest the electrical testing device according to the claimed invention.

Great Britain Patent document number 1,587,043, published on Mar. 25, 1981, describes a portable testing device for determining earth leakage, earthing continuity, and open circuit load conditions on an electrical appliance terminated with a three-pin plug. Great Britain '043 does not suggest the electrical testing device according to the claimed invention.

None of the above inventions and patents, taken either singly or in combination, is seen to describe the instant invention as claimed.

SUMMARY OF THE INVENTION

The present invention is one of several embodiments of an electrical testing device for determining the continuity between ground terminals of an electrical power extension cord and determining the electrical grounding of an electrical power tool. The electrical testing device can also be configured to determine the proper polarity on each of the hot, negative, and ground cord wires of an electrical power extension cord. Each embodiment generally comprises a plastic case housing one or more batteries which supplies power to a test button and the ground terminal of a female receptacle installed in the case. The one or more batteries are preferably 9 volt batteries.

The top surface of the case includes a female receptacle, a test button, and a ground light. The top surface may also include a male plug and an additional female receptacle installed in the case. On the side of the case is an extending metal contact point. The test button is a single pole momentary contact test button. When this test button is actuated it closes the test button contacts thus completing a circuit which will illuminate the light if the light and the battery are good.

Accordingly, it is a principal object of the invention to provide an electrical testing device for effectively testing the ground continuity between ends of an electrical power cord and for testing the electrical grounding of an electrical power tool.

It is another object of the invention is to provide an electrical testing device which is simple, small and portable.

It is a further object of the invention to provide an electrical testing device for testing the continuity and polarity of the hot, negative, and ground terminals of the female and male ends of an electrical power extension cord.

It is an object of the invention to provide improved elements and arrangements thereof in an electrical testing device for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The present invention is an electrical testing device for determining the continuity between ground terminals of an electrical power extension cord and determining the electrical grounding of an electrical power tool. The present invention also provides for an arrangement for insuring that electrical power extension cords have proper polarity on each of the hot, negative, and ground cord wires. Due to safety regulations, electrical power tools and equipment are periodically tested for proper operating conditions to prevent accidents/electrical shock. This normally involves going out into construction sites and carrying out tests on the electrical power tools and equipment at routine intervals of time.

Electrical power extension cords as well as electrical power tools such as drills, saws, and the like normally operate from a standard 120V outlet which includes a three-socket female receptacle having contacts which are supplied electrical power by incoming hot, neutral, and ground conductors. The electrically powered tools must have their metal frames grounded for safety and this ground is normally provided by a wire connection from the frame to a ground wire in the electrical circuit of the tool which mates through the plug of the tool to the ground conductor of the electrical outlet receptacle. In the event a short should occur between one of the power carrying conductors of the tool and the frame of the tool, the tool is automatically grounded. In order that the grounding be effected any electrical power extension cord through which the tool is operated must be of proper wiring polarity.

Figure 1:
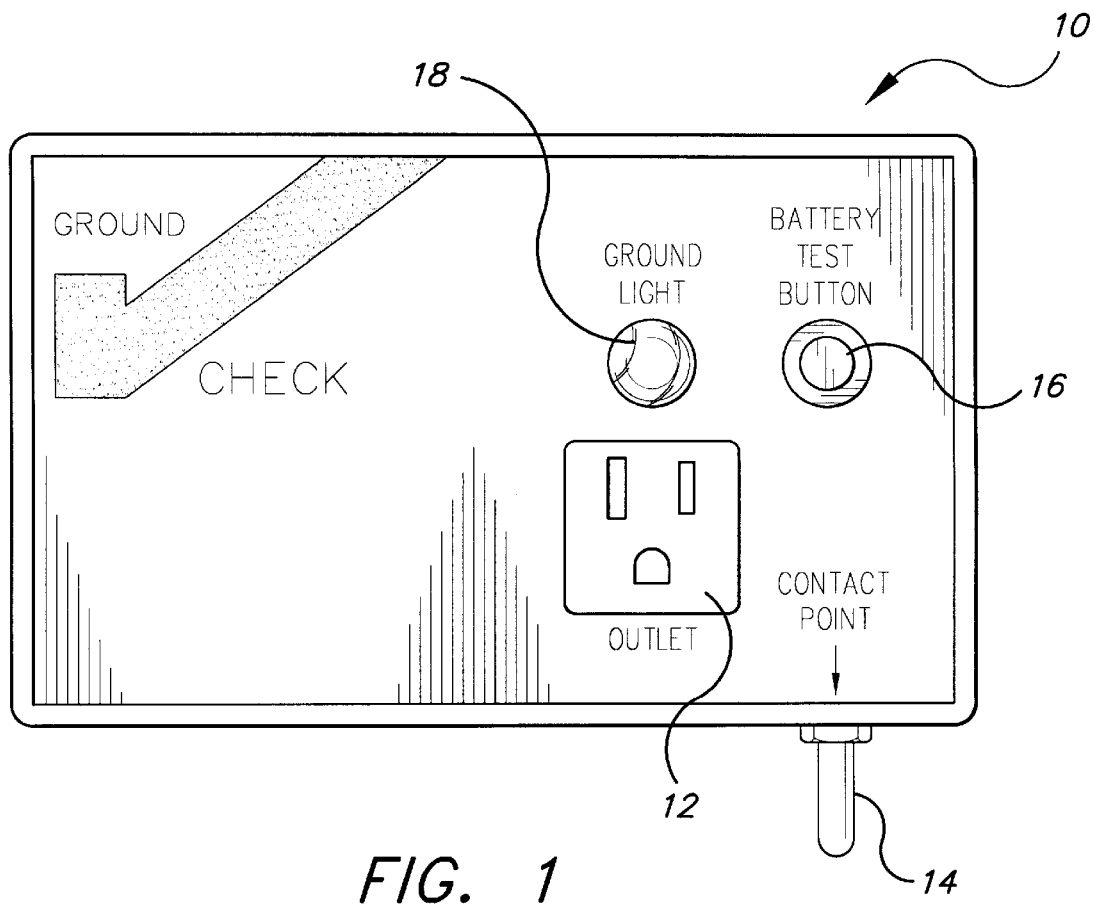
FIG. 1 is a top view of a first embodiment of an electrical testing device according to the invention.

Referring now to the drawings, FIG. 1 illustrates a first embodiment of an electrical testing device designated generally at 10. The electrical testing device 10 generally comprises a plastic case housing a battery which supplies power both to a test button 16 and the ground portion of a female receptacle installed in the case. The battery is preferably a 9 volt battery. The case for the testing device 10 preferably measures 5¾ inch×3½ inch×1¼ inch. Obviously, the size of the case may vary to meet manufacturing needs.

Figure 2:
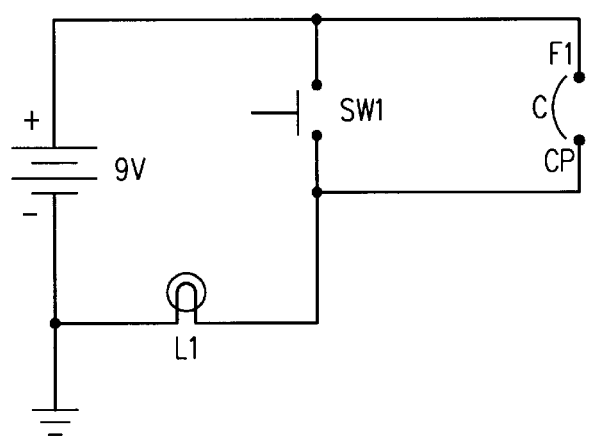
FIG. 2 is an electrical circuit diagram of the first embodiment of the invention.

The top surface of the case includes a female receptacle 12, a test button 16, and a ground light 18. On the side of the case is a contact point 14 in the form of a projecting metal element. The test button 16 is a single pole momentary contact pushbutton. When this test button 16 is actuated it closes the switch (Sw1) contacts thus completing a circuit which will illuminate the light 18 if the light and the battery are good. As shown in FIG. 2, the positive battery terminal is connected to the test button 16 (SW1) and the ground terminal of the female receptacle 12 (F1) The ground light 18 (L1) is connected between the negative battery terminal, the test button 16 (SW1) and the contact point 14 (CP1). When the test button 16 is depressed the ground light 18 illuminates if there is a sufficiently powered battery installed in the case.

To test the ground continuity of an electrical power extension cord, the male cord end of the cord is inserted into the female receptacle 12 on the testing device 10. The ground terminal of the female cord end of the cord is brought into contact with the contact point 14. If continuity exists between the ground terminal on the male end of the cord with the ground terminal on the female end of the cord, the ground light 18 will illuminate. If the light does not illuminate a discontinuity exists between the ground terminal on the male end of the cord and the ground terminal on the female end of the cord.

To test the electrical grounding of an electrically powered tool (not shown), the male plug of the tool power cord is inserted into the female receptacle 12 on the testing device 10. The metal case of the power tool is brought into contact with the contact point 14. If the power tool is electrically grounded a connection will exist between the ground terminal on the male end of the tool power cord and the contact point 14, and the ground light 18 will illuminate. If the light 18 does not illuminate the power tool is not properly grounded.

Figure 3:
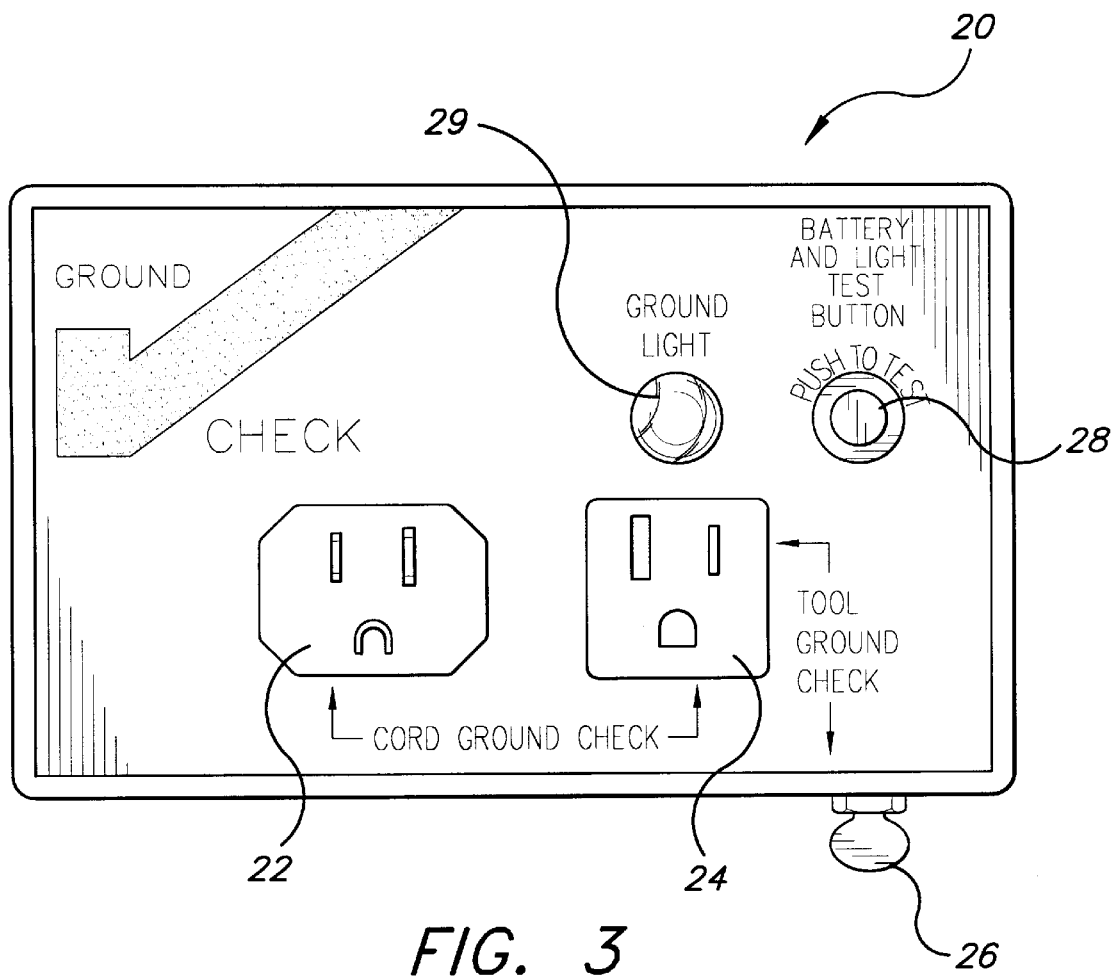
FIG. 3 is a top view of a second embodiment of an electrical testing device according to the invention.

FIG. 3 illustrates a second embodiment of an electrical testing device designated generally at 20. The electrical testing device 20 comprises a plastic case housing a battery which supplies power both to a test button 28 and the ground terminals of a male plug 22 and a female receptacle 24 installed in the case. The battery is preferably a 9 volt battery. The case for the testing device 20 preferably measures 5¾ inch×3½ inch×1¼ inch. Obviously, the size of the case may vary to meet manufacturing needs.

Figure 4:
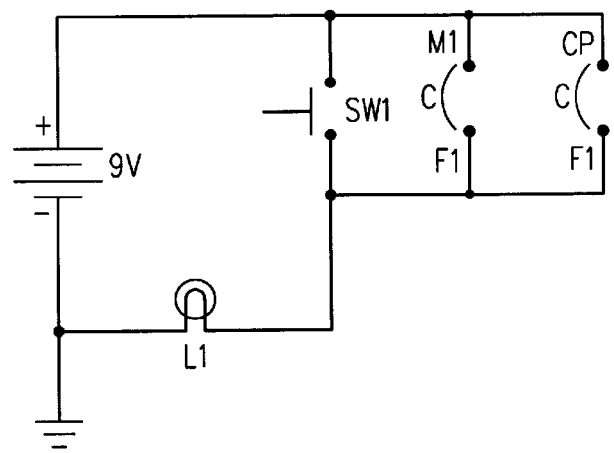
FIG. 4 is an electrical circuit diagram of the second embodiment of the invention.

The top surface of the case includes the male plug 22, the female receptacle 24, a test button 28, and a ground light 29. On the side of the case is a contact point 26 in the form of a projecting metal element. As shown in FIG. 4, the positive battery terminal is connected to the test button 28 (SW1), the ground terminal of the male receptacle 22 (M1), and the contact point 26 (CP). The ground light 28 (L1) is connected between the negative battery terminal, the test button 28 (SW1), and the ground terminal of the female receptacle 24. The test button 28 is a single pole momentary contact pushbutton. When this test button 28 is actuated it closes the switch (SW1) contacts thus completing a circuit which will illuminate the light 28 if the light and the battery are good.

To test the ground continuity of an electrical power extension cord, the female cord end of the cord is inserted onto the male plug 22 and the male cord end of the cord is inserted into the female receptacle 24 on the testing device 20. If continuity exists between the ground terminal on the female end of the power cord with the ground terminal on the male end of the power cord, the ground light 28 will illuminate. If the light 28 does not illuminate a discontinuity exists between the ground terminal on the female end of the power cord and the ground terminal on the male end of the power cord.

To test the electrical grounding of an electrically powered tool (not shown), the male plug of a tool power cord is inserted into the female receptacle 24 on the testing device 20. The metal case of the power tool is brought into contact with the contact point 26. If the power tool is electrically grounded a connection will exist between the ground terminal on the male end of the tool power cord and the contact point 26, and the ground light 28 will illuminate. If the light 28 does not illuminate the power tool is not properly grounded.

Figure 5:
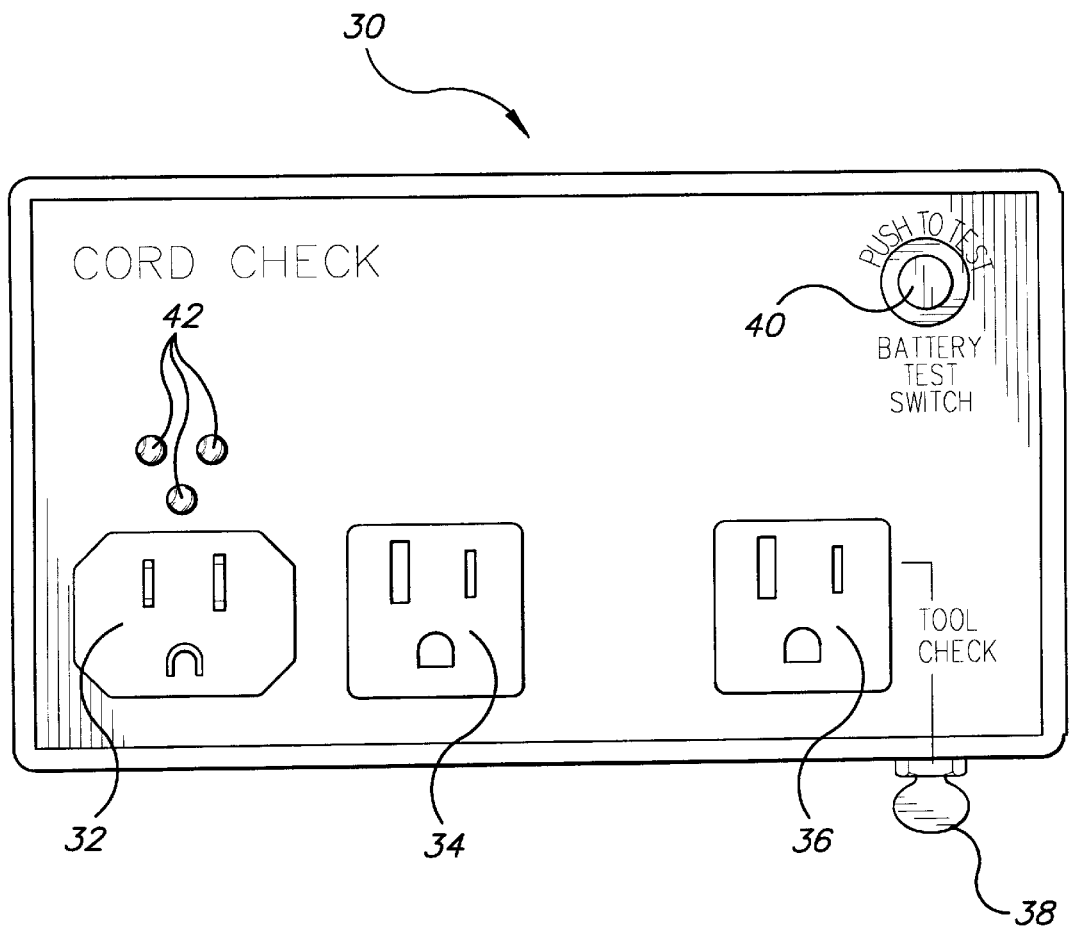
FIG. 5 is a top view of a third embodiment of an electrical testing device according to the invention.

FIG. 5 illustrates a third embodiment of an electrical testing device designated generally at 30. The electrical testing device 30 comprises a plastic case housing three batteries which supply power to a test button 40, the ground terminal of a second female receptacle 36 installed on the testing device 30, and the hot, negative, and ground terminals of a male plug 32 and a first female receptacle 34 installed in the plastic case. The batteries are preferably 9 volt batteries.

Figure 6:
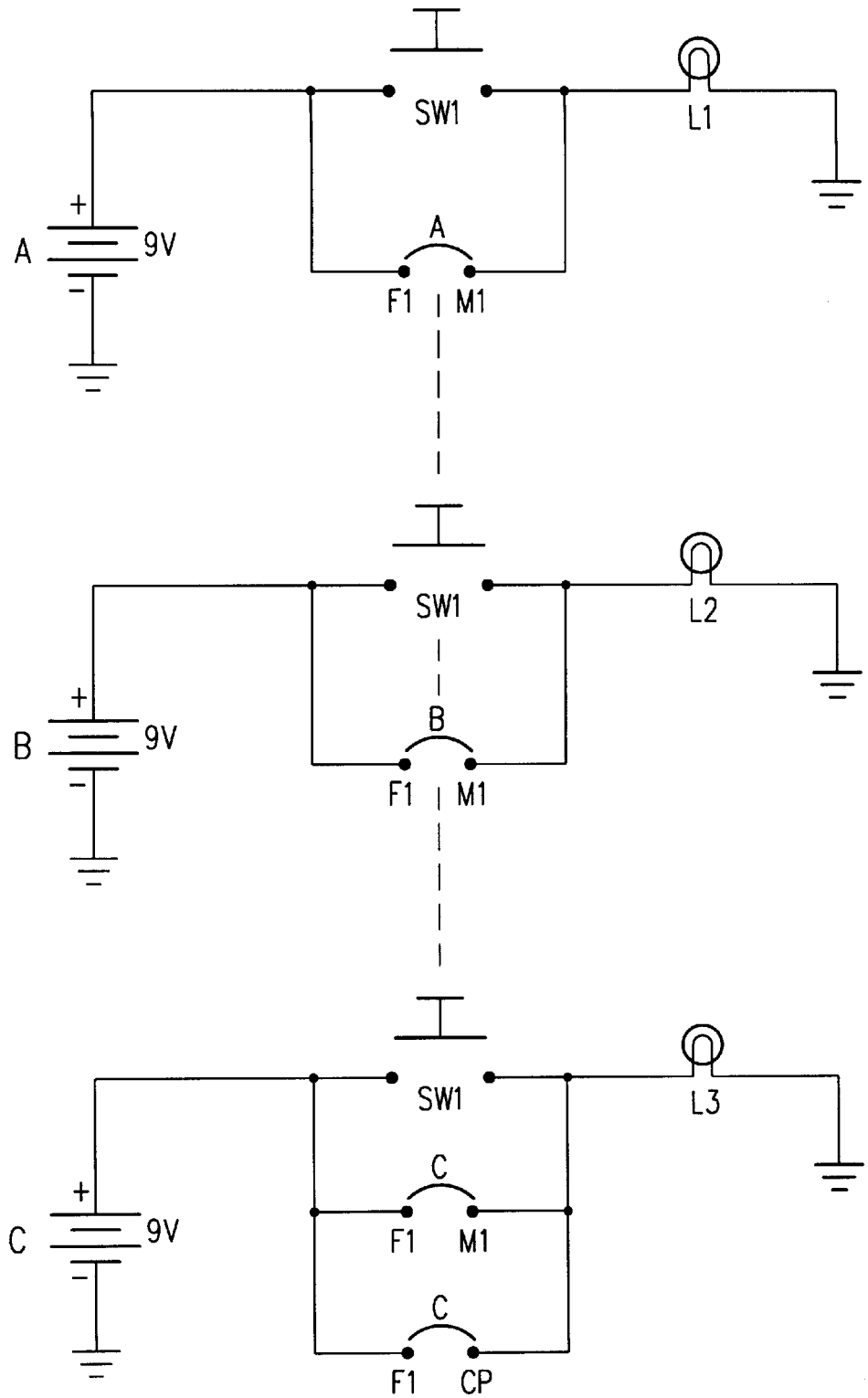
FIG. 6 is an electrical circuit diagram of the third embodiment of the invention.

The top surface of the case includes the male plug 32, the first female receptacle 34, the second female receptacle 36, a test button 40, and green and blue indicator lights 42. On the side of the case is a contact point 38 in the form of a projecting metal element. As shown in FIG. 6, the positive battery terminal is connected to the test button 40 (SW1). The test button 40 is a single pole momentary contact pushbutton. When this test button 40 is actuated it closes the switch (SW1) contacts thus completing a circuit which will illuminate the indicator lights 42 if the light and the battery are good.

To test the continuity and polarity of the hot, negative, and ground terminals (A,B,C) in an electrical power extension cord, the female cord end of the cord is inserted onto the male plug 32 and the male cord end of the cord is inserted into the female receptacle 34 of the testing device 30. If continuity and proper polarity exists between the hot, negative, and ground terminals (A,B,C) of the female and male ends of the cord, the green and blue indicator lights 42 (L1, L2, L3) will illuminate. If continuity and proper polarity does not exist between any of the terminals of the cord, one or more of the green and blue indicator lights 42 (L1, L2, L3) will not illuminate.

To test the electrical grounding of an electrically powered tool (not shown), the male plug of a tool power cord is inserted into the female receptacle 36 on the testing device 30. The metal case of the power tool is brought into contact with the contact point 38. If the power tool is electrically grounded a connection will exist between the ground terminal on the male plug of the tool power tool cord and the contact point 38, and the lower light of the three indicator lights 42 will illuminate. If the light does not illuminate the power tool is not properly grounded.

Figure 7:
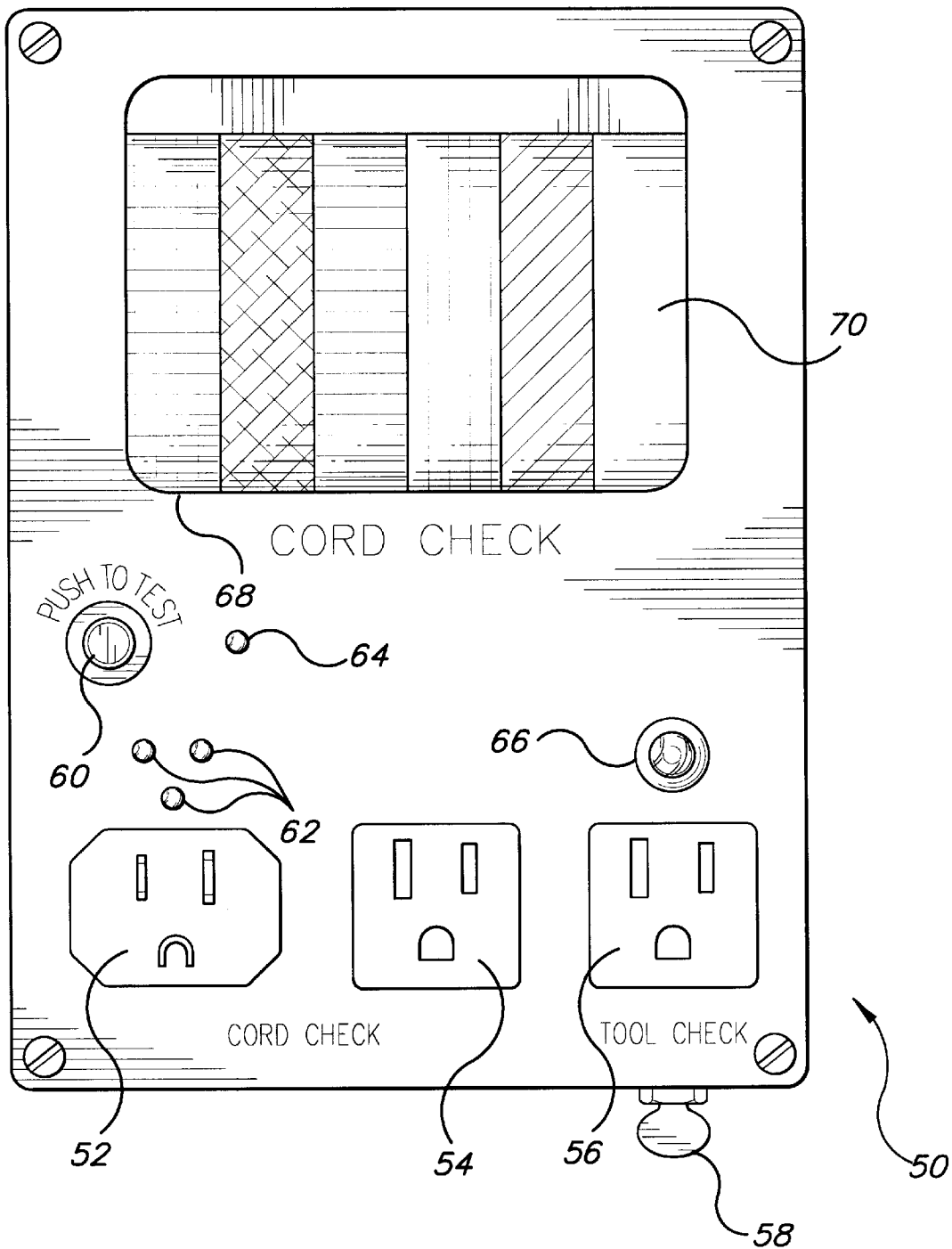
FIG. 7 is a top view of a fourth embodiment of an electrical testing device according to the invention.
Figure 8:
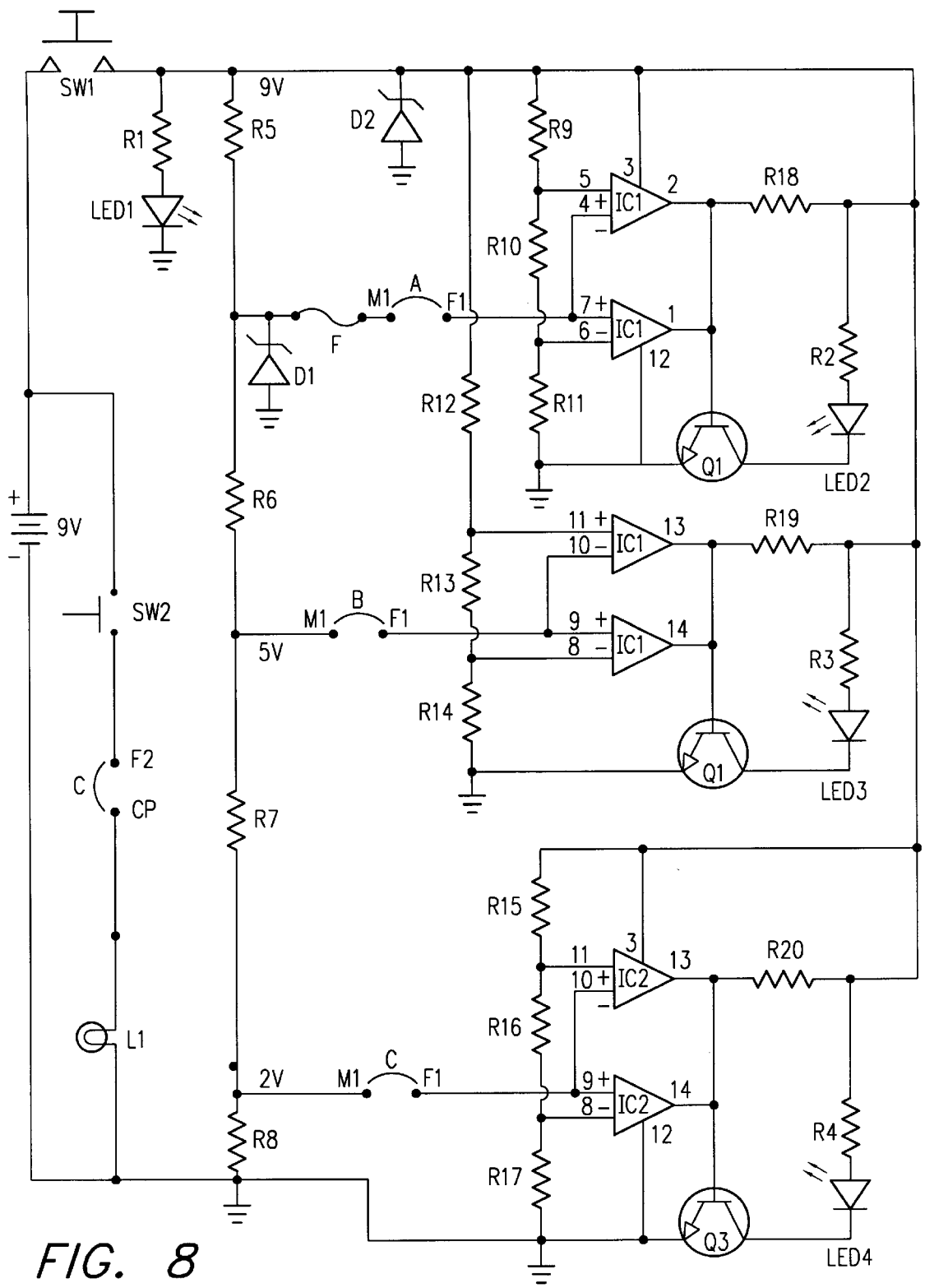
FIG. 8 is an electrical circuit diagram of the fourth embodiment of the invention.

FIG. 7 illustrates a fourth embodiment of an electrical testing device designated generally at 50. The electrical testing device 50 comprises a plastic case housing a battery which supplies power to a test button 60, the ground terminal of a second female receptacle 56 installed on the testing device 50, and an internal circuit which interconnects the hot, negative, and ground terminals of a male plug 52 and a first female receptacle 54 installed on the testing device 50. The battery is preferably a 9 volt battery.

The top surface of the case includes the male plug 52, the first female receptacle 54, the second female receptacle 56, a test button 60, green LED indicator lights 62, a red LED indicator light 64, a red ground light 66, and a tape receptacle 68 for holding color coded tape 70. On the side of the case is a contact point 58 in the form of a projecting metal element. As shown in FIG. 6, the positive battery terminal is connected to the test button 60 (SW1). The test button 60 is a single pole momentary contact pushbutton. When this test button 60 is actuated it closes the switch (SW1) contacts thus completing a circuit which will illuminate the red LED light 64 (LED1) if the light and the battery are good. As shown in FIG. 6, the internal circuit interconnecting the hot, negative, and ground terminals (A,B,C) of the installed male plug 52 and the hot, negative, and ground terminals (A,B,C) of the installed female receptacle 54.

To test the continuity and polarity of the hot, negative, and ground terminals (A,B,C) in an electrical power extension cord, the female cord end of the cord is inserted onto the male plug 52 and the male cord end of the cord is inserted into the female receptacle 54 of the testing device 50. If continuity and proper polarity exists between the hot, negative, and ground terminals (A,B,C) of the female and male ends of the cord, the green LED indicator lights 62 (LED2, LED3, LED4) will illuminate. If continuity and polarity does not exist between any of the terminals of the cord, one or more of the green LED indicator lights 62 will not illuminate.

To test the electrical grounding of an electrically powered tool (not shown), the male plug of the tool power cord is inserted into the female receptacle 56 on the testing device 50. The metal case of the power tool is brought into contact with the contact point 58. If the power tool is electrically grounded a connection will exist between the ground terminal on the male end of the tool power cord and the contact point 58, and the red ground light 66 will illuminate. If the red light 66 does not illuminate the power tool is not properly grounded.

In the illustrated fourth embodiment of the electrical testing device 50 the circuit elements are preferably, but not limited to:

| Component | Part Number or rating |
|-----------|----------------------|
| R1 | 1 kΩ |
| R2 | 1 kΩ |
| R3 | 1 kΩ |
| R4 | 1 kΩ |
| R5 | 2.4 kΩ |
| R6 | 2.6 kΩ |
| R7 | 3.9 kΩ |
| R8 | 3 kΩ |
| R9 | 2.2 kΩ |
| R10 | 1.8 kΩ |
| R11 | 13 kΩ |
| R12 | 6.6 kΩ |
| R13 | 1.8 kΩ |
| R14 | 10 kΩ |
| R15 | 6.8 kΩ |
| R16 | 1.8 kΩ |
| R17 | 10 kΩ |
| R18 | 10 kΩ |
| R19 | 10 kΩ |
| R20 | 10 kΩ |
| IC1 | LM 339 |
| IC2 | MPS 2222A |
| LED1-4 | GREEN 2.8V |
| SW1 | SPST PUSH |
| D1 | 7V 5W ZENER |
| D2 | 9V 1W ZENER |

It is to be understood that the present invention is not limited to the embodiments described above, but encompasses any and all embodiments within the scope of the following claims.

I claim:

1. An electrical testing device for determining the continuity between ground terminals of an electrical power cord and determining the electrical grounding of an electrical power tool, said testing device comprising:

a case;

a power source installed in said case;

a female receptacle disposed in said case for receiving a three-prong plug;

a test button for testing said power source;

indicating means on said case for indicating proper ground continuity; and a metal contact element extending from said case;

whereby the determination of proper grounding occurs upon inserting a plug of an electrical power cord or an electrical power tool into said female receptacle and contacting said metal contact element with a ground terminal in the electrical power cord or a conductive portion of the electrical power tool.

2. The electrical testing device according to claim 1, wherein said case is plastic.

3. The electrical testing device according to claim 1, wherein said power source is a nine volt battery.

4. The electrical testing device according to claim 1, wherein said indicating means includes a light for also indicating sufficient power upon actuating said test button.

5. An electrical testing device for determining the continuity between ground terminals of an electrical power cord and determining the electrical grounding of an electrical power tool, said electrical testing device comprising:

a case;

a power source installed in said case;

a female receptacle disposed in said case for receiving a three-prong plug;

a test button on said top surface for testing said power source;

indicating means on said case for indicating proper ground continuity;

a metal contact element extending from said case;

a plurality of rolls of tape, each of said rolls of tape being color coded; and a tape receptacle integrally formed in said case for holding said plurality of rolls of color coded tape;

whereby proper ground continuity is determined upon inserting a plug of an electrical power cord or an electrical power tool into said female receptacle and contacting said metal contact element with a ground terminal in the electrical power cord or a conductive portion of the electrical power tool and marking the electrical power cord or electrical power tool with a piece of the color coded tape to show results of the testing device.

6. A testing device for determining the continuity between ground terminals of an electrical power cord and determining the electrical grounding of an electrical power tool, said device comprising:

circuit means for testing ground continuity;

means for supplying electrical power to said circuit means;

means for receiving a three-prong plug having a ground terminal;

said circuit means coupled to said ground terminal;

means for making electrical contact coupled to said circuit means;

means for testing said power source for sufficient power;

means for selectively indicating proper ground continuity and sufficient power;

a case for housing said circuit means, said means for supplying, said means for receiving, means for making electrical contact, said means for testing, and said means for indicating;

at least one roll of color coded tape; and tape receptacle means on said case for holding said at least one roll of tape.

7. The device according to claim 6, wherein said means for testing said power source includes a switch for closing said circuit means.

8. The device according to claim 6, wherein said means for receiving a three-prong plug includes at least one female receptacle, said ground terminal being disposed in said female receptacle.

9. The device according to claim 8, wherein said means for electrical contact includes a metal contact element extending from said case means;

whereby ground continuity is determined by inserting a plug of an electrical power cord or an electrical power tool into said female receptacle and contacting said metal contact element with a ground terminal in the electrical power cord or a conductive portion of the electrical power tool and marking the electrical power cord or electrical power tool with a piece of the color coded tape to show results of the testing device.

10. The device according to claim 6, wherein said means for supplying power includes at least one battery.

11. The device according to claim 10, wherein said at least one battery includes a nine volt battery.

12. The device according to claim 6, wherein said means for selectively indicating includes a light.

13. The electrical testing device according to claim 1, further including circuit means for electrical coupling said test button in parallel with said female receptacle and said metal contact;

wherein said test button closes a conductive path including said power source and said means for indicating.

14. The electrical testing device according to claim 1, further including circuit means for electrical coupling said test button in parallel with said female receptacle and said metal contact;

wherein the proper ground line of the electrical cord or the electrical power tool closes a conductive path including said power source and said means for indicating.

15. The electrical testing device according to claim 1, further including a tape receptacle for holding color coded tape for marking the electrical power cords and electrical power tools having proper ground continuity.

* * * * *